(12) United States Patent
Yazawa

(10) Patent No.: US 6,195,454 B1
(45) Date of Patent: *Feb. 27, 2001

(54) COMPONENT MOUNTING APPARATUS

(75) Inventor: Takayuki Yazawa, Nagano (JP)

(73) Assignee: Kabushiki Kaisha Sankyo Seiki Seisakusho, Nagano (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/746,704

(22) Filed: Nov. 15, 1996

(30) Foreign Application Priority Data

Nov. 15, 1995 (JP) .................................................. 7-296519

(51) Int. Cl.$^7$ ........................................................ G06K 9/00
(52) U.S. Cl. ........................... 382/151; 382/149; 348/125
(58) Field of Search ..................... 382/143, 145, 382/151, 199, 184, 141, 149; 348/86, 87, 90, 91, 92, 94, 95, 125, 129, 130, 126; 356/237; 29/25.01

(56) References Cited

U.S. PATENT DOCUMENTS

| | | | |
|---|---|---|---|
| 4,914,513 | * 4/1990 | Spigarelli et al. | 358/901 |
| 5,113,565 | * 5/1992 | Cipolla et al. | 348/95 |
| 5,157,734 | * 10/1992 | Chen et al. | 348/95 |
| 5,237,622 | * 8/1993 | Howell | 382/151 |
| 5,251,266 | * 10/1993 | Spigarelli et al. | 382/151 |

\* cited by examiner

*Primary Examiner*—Bhavesh Mehta
(74) *Attorney, Agent, or Firm*—Sughrue, Mion, Zinn, Macpeak & Seas, PLLC

(57) ABSTRACT

A component mounting head has a holding unit including, for example, a suction nozzle for holding a component such as a TCP, and a camera. The camera simultaneously detects the position of a target reference mark and the TCP. An angle adjusting mechanism adjusts an angle of the holding unit based on a holding angle error, and a head moving mechanism moves the component mounting head based on the position of the target reference mark and the TCP, thereby positioning the TCP to the target position.

10 Claims, 6 Drawing Sheets

COMPONENT MOUNTING APPARATUS

BACKGROUND OF THE INVENTION

1. Field of the Invention

The invention relates to a component mounting apparatus which mounts a component to a target position, and more particularly to a component mounting apparatus comprising a camera which detects a position of a component and a target mounting position.

2. Related Art

A component mounting apparatus mounts a component such as a TCP (Tape Carrier Package) on a printed circuit board to be attached into a personal computer, by using a robot. In such an apparatus, a single camera fixed to the apparatus detects the position of a component held by the robot, and another camera fixed to a head detects a target position on the board. Then, moving distances in the X-axis and Y-axis directions of the robot are calculated from the component position and the target position, the robot is moved, and the component is mounted to the target position on the board.

In the above-described component mounting apparatus, however, the component position and the target position are detected by separate cameras and the robot is moved based on the component position and the target position, so that the positional accuracy of the cameras and the moving accuracy of the robot directly affect the mounting accuracy of the component. Thus, it is difficult to mount a component to the target position with high accuracy.

Specifically, the moving distances of the robot are calculated from the component position and the target position detected by the respective cameras. If there exists an error in positions of the cameras, therefore, errors may occur in the moving distances. Additionally, errors may occur between the calculated moving distances and the actual moving distances of the robot which is moved based on the calculated moving distances. Moreover, errors may occur in various portions depending on variations in temperature or humidity during the operation. For these reasons, it is difficult to increase the mounting accuracy of a component.

In order to increase the moving accuracy of the robot, it may be contemplated that a linear scale is provided. However, this increases the cost.

SUMMARY OF THE INVENTION

It is an object of the invention to provide a component mounting apparatus which can mount a component at a low cost and with high accuracy.

In order to attain the object, the component mounting apparatus comprises: a component mounting head having a holding unit which holds a supplied component and mounts the component to a predetermined target position, and a camera which detects a position of a target reference mark formed in the vicinity of the target position, detects a holding position of the held component with respect to the holding unit, and simultaneously detects the position of the target reference mark and the holding position; error calculating means for calculating an error of a holding angle of the component on the basis of the position of the target reference mark and the holding position; an angle adjusting mechanism which adjusts an angle of the holding unit on the basis of the holding angle error; and a head moving mechanism which moves the component mounting head on the basis of the position of the target reference mark and the holding position of the component, thereby positioning the component to the target position.

Before holding a component, accordingly, the component mounting head is moved by the head moving mechanism to the target position, and the camera detects the target reference mark. After the detection, a supplied component is held by the holding unit, and the camera detects the holding position of the component with respect to the holding unit. An error of the holding angle of the component is calculated on the basis of the holding position of the component and the position of the target reference mark which is previously detected. Based on the holding angle error, the angle of the holding unit is adjusted by the angle adjusting mechanism, so that the angle of the component is made coincident with the angle of the target position.

Next, the component mounting head is again moved to the target position so that the component is made substantially coincident with the target position. Then, the camera detects the component, and simultaneously detects the target reference mark. Thereafter, the component position is compared with the position of the target reference mark. On the basis of the comparison, the position of the component mounting head is finely adjusted so that the component position is made coincident with the target position, and the component is then mounted.

The operations of detection of the component position, adjustment of the angle, positioning, and the like may be conducted after the component mounting head is moved to the target position in the condition where the head sucks the component.

In the component mounting apparatus, the holding unit disposed on the component mounting head is a suction nozzle which sucks and holds the component, a camera is disposed at two positions located on both sides of the suction nozzle, the angle adjusting mechanism is rotating means for rotating the suction nozzle, means for reciprocating the suction nozzle is disposed on the component mounting head, and the head moving mechanism moves the component mounting head in X-axis and Y-axis directions on a working table.

Accordingly, when a supplied component is to be taken out by the holding unit, the component is sucked and held by the suction nozzle in the condition where the suction nozzle is advanced by the nozzle reciprocating mechanism. Then, the suction nozzle is retracted by the nozzle reciprocating mechanism, so that the component is lifted. When the component is to be mounted to the target position, the suction nozzle is advanced by the nozzle reciprocating mechanism. In this condition, the suction and holding are canceled and the mounting of the component is performed.

When the angle of the holding unit is to be adjusted on the basis of the holding angle error of the component, the suction nozzle is rotated together with the component. The two cameras detect the positions of target reference marks respectively formed in two or more places among which the held component is interposed.

DETAILED DESCRIPTION OF THE PREFERRED EMBODIMENTS

Hereinafter the configuration of the invention will be described in detail by way of an embodiment shown in the accompanying drawings. In the embodiment, a component mounting apparatus which mounts a TCP on a printed circuit board will be described. It is appreciated that the invention can be applied to a component mounting apparatus for mounting another kind of component on another type of board or the like.

Figure 2:
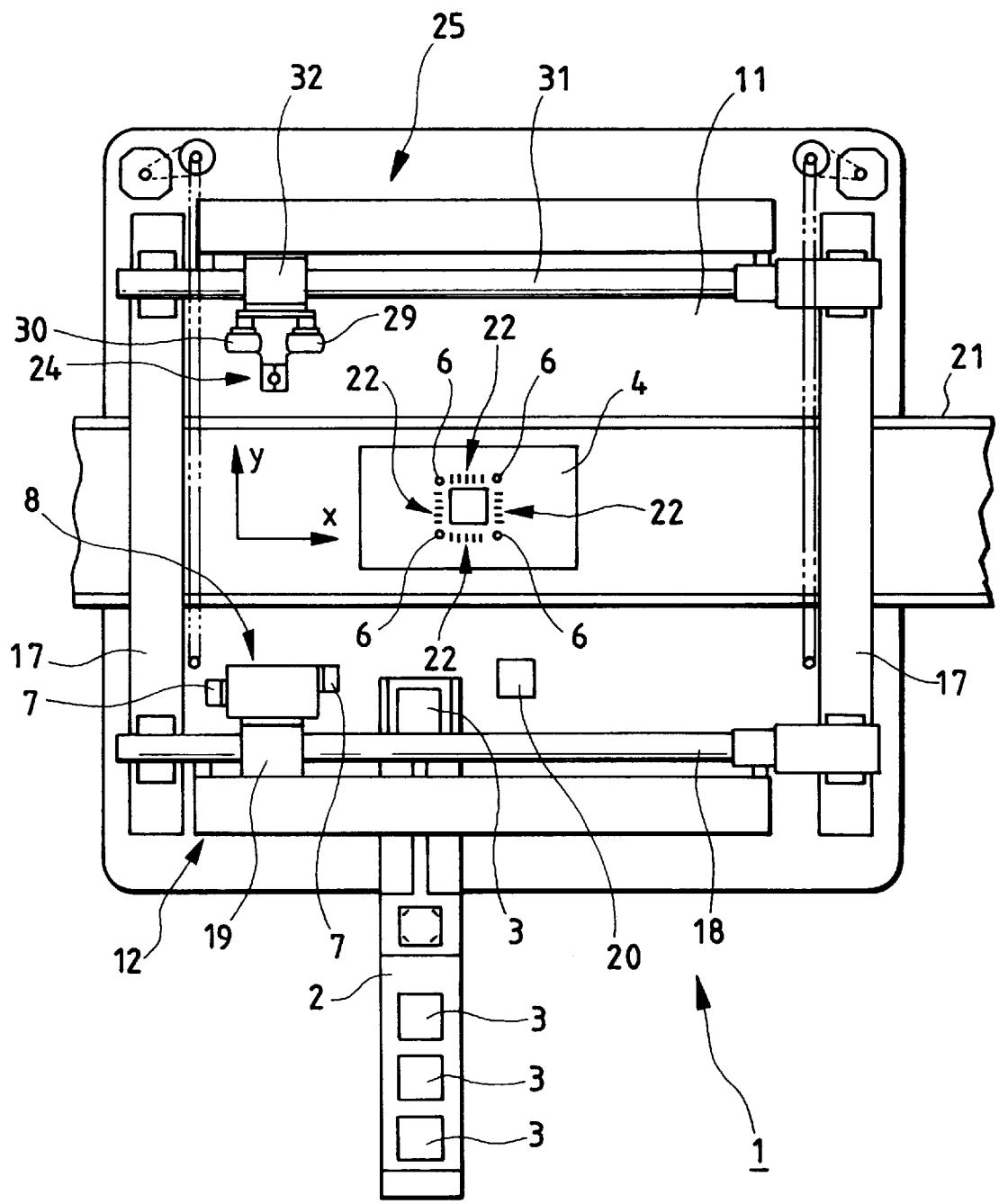
FIG. 2 is a plan view showing the whole of the component mounting apparatus.
Figure 3A:
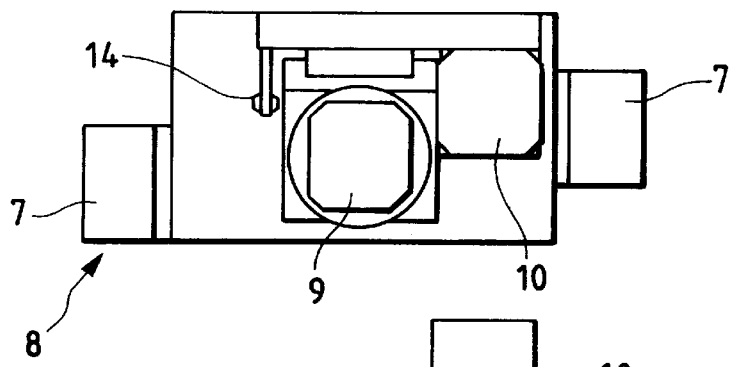
FIG. 3 is a view showing a component mounting head, in which FIG. 3 (A) is a plan view, FIG. 3 (B) is a front view, and FIG. 3 (C) is a bottom view.
Figure 3B:
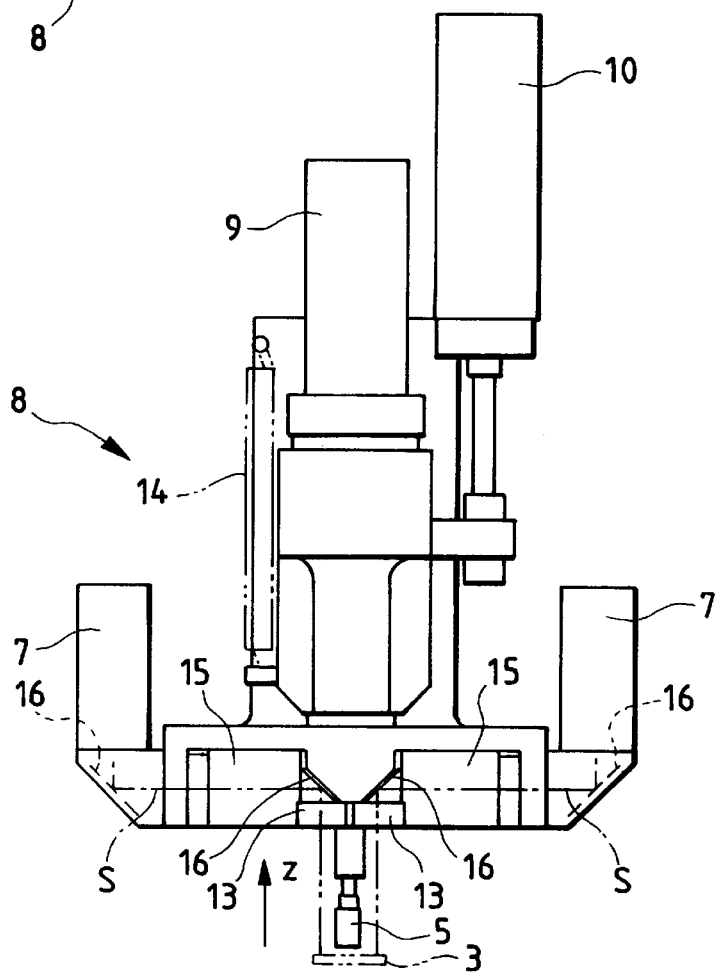
Figure 3C:
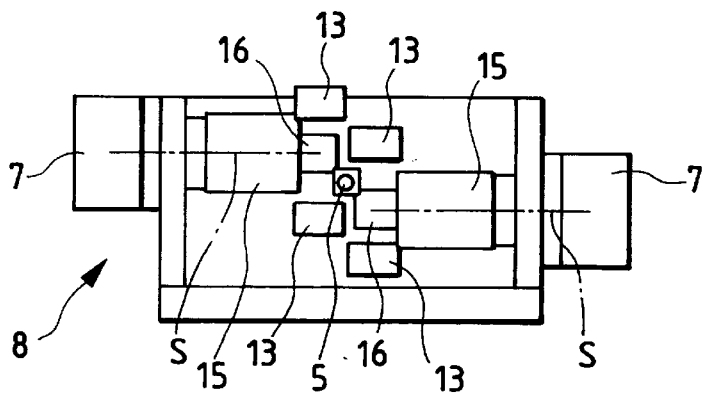

As shown in FIGS. 2 and 3, the component mounting apparatus 1 comprises a component mounting head 8 having: a holding unit consisting of a suction nozzle 5 which holds a component such as a TCP 3 supplied from a feeder 2 and mounts the TCP 3 to a predetermined target position, for example, a mounting position on a printed circuit board 4; and cameras 7 which detect the holding position and the holding angle of the TCP 3 and detect the positions of target reference marks 6 formed in the vicinity of the attachment position on the printed circuit board 4. The component mounting apparatus further comprises a rotation motor 9 serving as an adjusting mechanism which adjusts the angle of the suction nozzle 5; a reciprocation motor 10 serving as a nozzle reciprocating mechanism which advances and retracts the suction nozzle 5; and a head moving mechanism 12 which moves the component mounting head 8 over a working table 11 (hereinafter referred to as XY plane).

As shown in FIG. 3, the component mounting head 8 comprises: the suction nozzle 5 which sucks and holds the TCP 3 in a direction perpendicular to the working table 11 (hereinafter referred to as Z-axis direction); the two cameras 7 respectively having fields of view F which are two places in the vicinity of the suction nozzle 5 and on both sides of the nozzle; a light 13 which illuminates the TCP 3 held by the suction nozzle 5; the rotation motor 9 serving as the angle adjusting mechanism which rotates the suction nozzle 5 about the Z axis; the reciprocation motor 10 serving as the nozzle reciprocating mechanism which slides the suction nozzle 5 along the Z axis; and a spring 14 which urges the suction nozzle 5 along the Z-axis direction in a direction separating from the working table 11.

Optical elements such as a lens 15 and a mirror 16 are disposed on each of the optical paths S of the imaging optical systems of the cameras 7. Accordingly, the optical paths S are bent, so that the cameras 7 can be attached at positions which do not face the respective imaging positions. Any other imaging optical system may be employed as far as two images on the XY plane and on the both sides of the suction nozzle 5 can be separately detected. The attachment positions of the cameras 7 are not limited as far as the cameras 7 can be integrally attached to the component mounting head 8. In the embodiment, the two cameras 7 which are disposed at diagonal positions are used. Alternatively, one camera or three or more cameras may be used. According to the configuration of the embodiment, the positions of a component which are separated by the largest distance can be detected by cameras of a small number, thereby improving the position detection accuracy.

As shown in FIG. 2, the head moving mechanism 12 comprises two Y-shafts 17 fixed to the working table 11, an X-shaft 18 for the head which can move along the Y-shafts 17, and a slider 19 which can slide with respect to the X-shaft 18 for the head and to which the component mounting head 8 is fixed. By the movement of the X-shaft 18 for the head and the slider 19, the component mounting head 8 can be moved in the X-axis direction and the Y-axis direction over the working table 11.

The feeder 2 takes out TCPs 3 which are stacked, one by one and in a predetermined posture, and supplies the TCP 3 onto the working table 11. The TCP 3 has the body of a square thin plate shape and a large number of minute terminals outwardly extending are disposed on the sides of the body. A light stage 20 which performs illumination in the Z-axis direction from the side of the working table 11, and a conveyer 21 for transporting the printed circuit board 4 are disposed on the working table 11.

Figure 1:
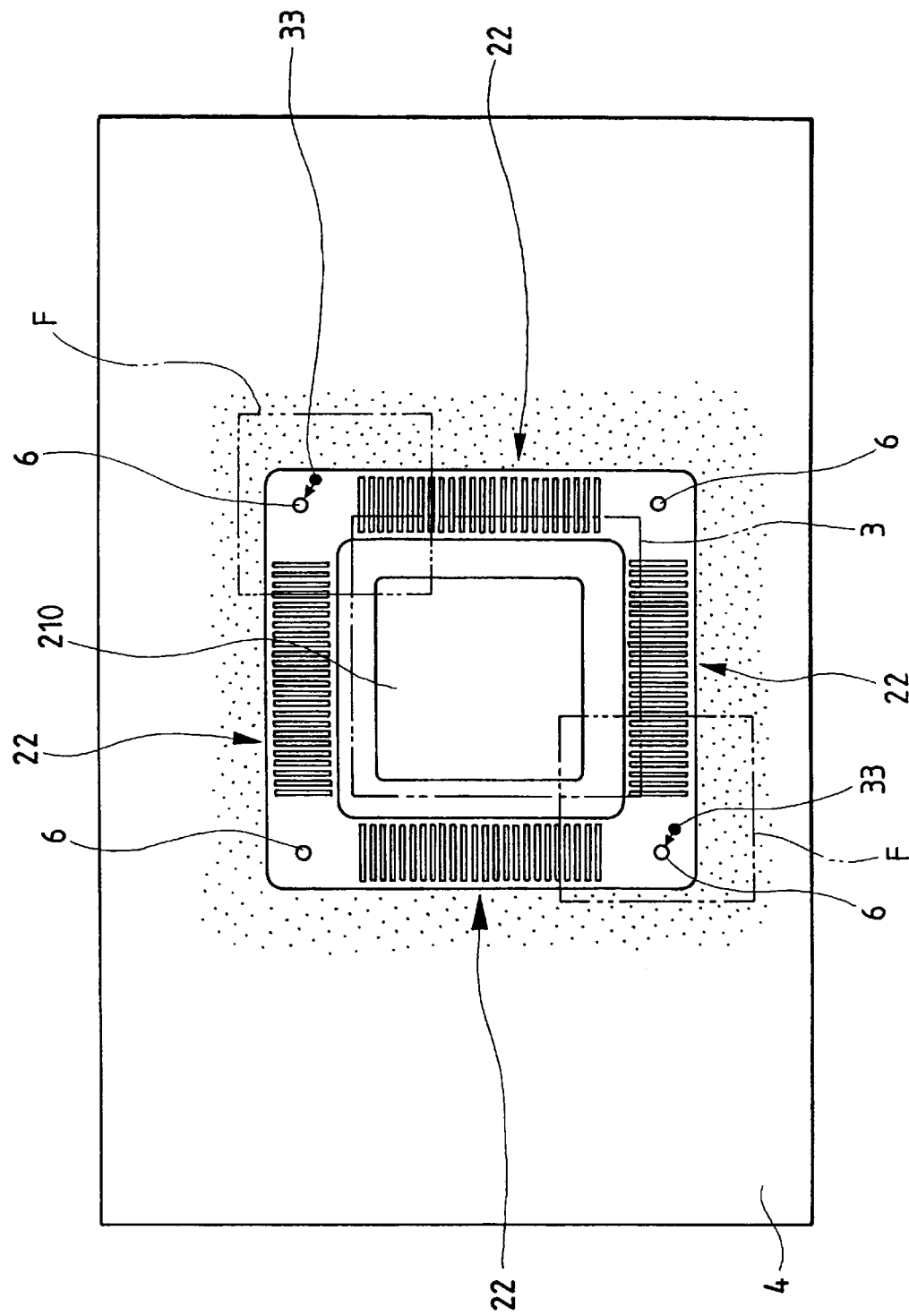
FIG. 1 is a plan view showing a positional relationship among a printed circuit board, a TCP, and fields of view of cameras in an embodiment of the component mounting apparatus of the invention.

As shown in FIG. 1, a die attachment pad 210 which the TCP 3 is to be attached to and has a substantially square shape is provided in a center portion of the printed circuit board 4. A number of printed patterns 22 for the terminals are formed around the die attachment pad 210 so as to be perpendicular to the respective sides of the square. In the vicinity of the four corners of the die attachment pad 21, target reference marks 6 which are four in total and have a small circular shape are respectively formed. The printed patterns 22 are solder plated. In the embodiment, the number of the target reference marks 6 is four. The number of the target reference marks may be changed depending on the accuracy required for mounting a component. In order to attain sufficiently high accuracy, preferably, two or more target reference marks 6 are provided.

Figure 4A:
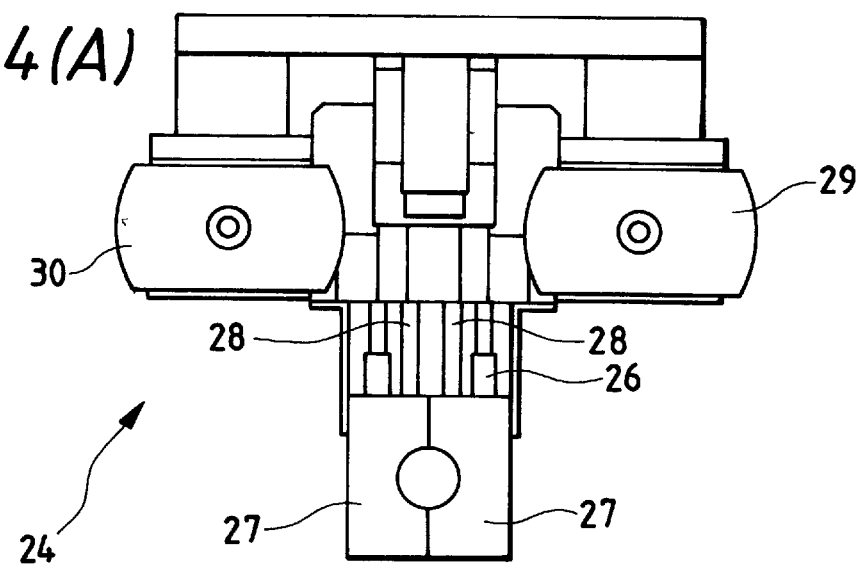
FIGS. 4 (A) and 4 (B) are views showing a heater head, in which FIG. 4 (A) is a plan view, and FIG. 4 (B) is a front view.
Figure 4B:
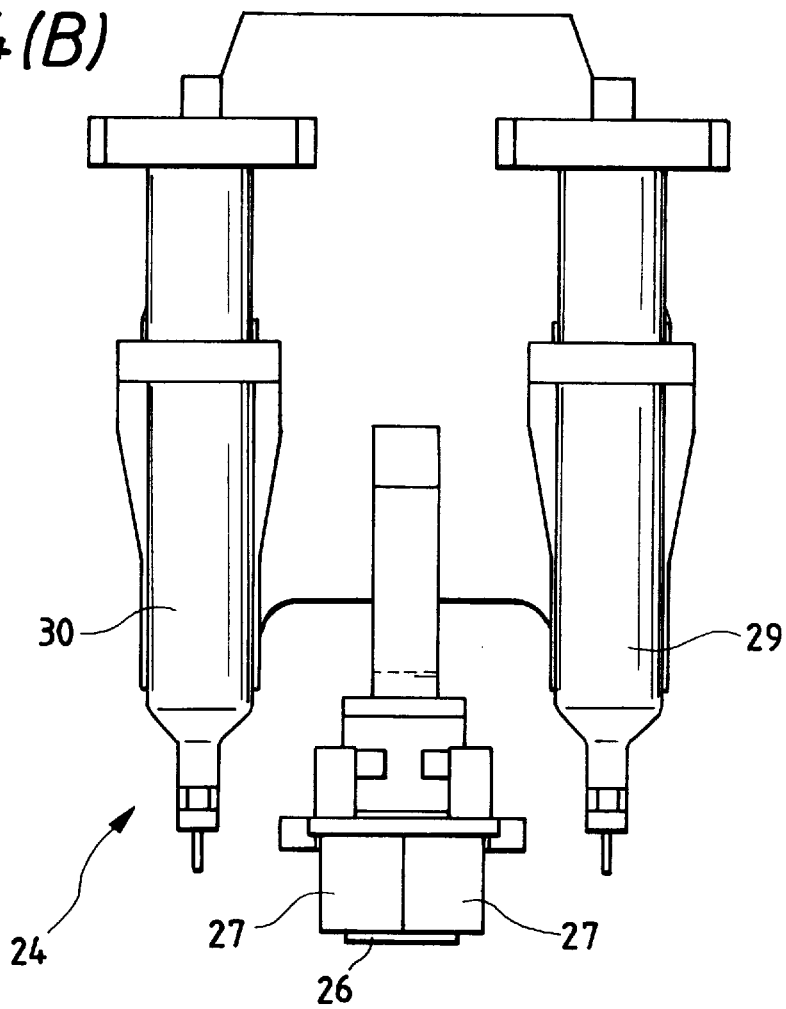
Figure 5:
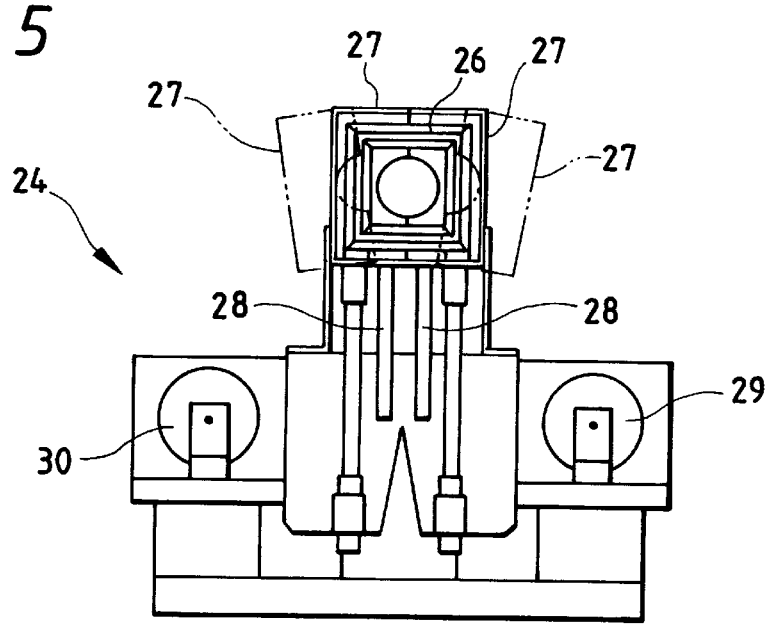
FIG. 5 is a bottom view showing the heater head.
Figure 6:
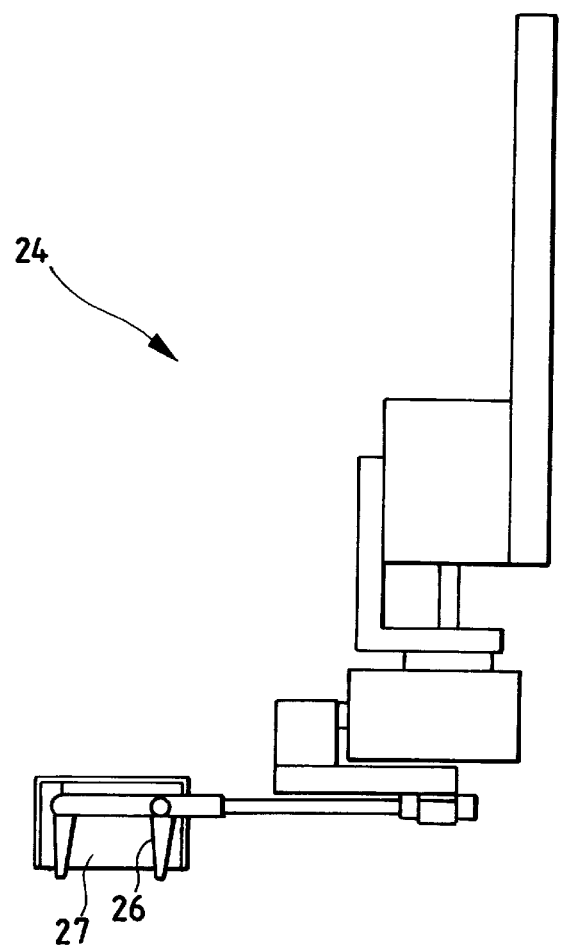
FIG. 6 is a side view showing a condition where one cover of the heater head is removed.

As shown in FIGS. 2 and 4, a heater head 24 which performs the soldering, and a heater moving mechanism 25 which moves the heater head 24 in the XY plane are disposed on the working table 11 of the component mounting apparatus 1. The heater head 24 comprises: a heater 26 having a square air supply opening through which hot air is blown out toward the working table 11; covers 27 which cover the heater 26 by surrounding the heater 26 from the sides thereof other than one face of the heater 26 which faces the working table 11; blowers 28 which aspirate the air in the conver 27; an injector 29 which supplies an adhesive; and an injector 30 which supplies flux.

The heater moving mechanism 25 comprises an X-shaft 31 for the heater which can move along the Y-shafts 17 fixed onto the working table 11, and a slider 32 which can slide with respect to the X-shaft 31 for the heater and to which the heater head 24 is fixed. By the movement of the X-shaft 31 for the heater and the slider 32, the heater head 24 can be moved in the X-axis and Y-axis directions over the working table 11.

Figure 7:
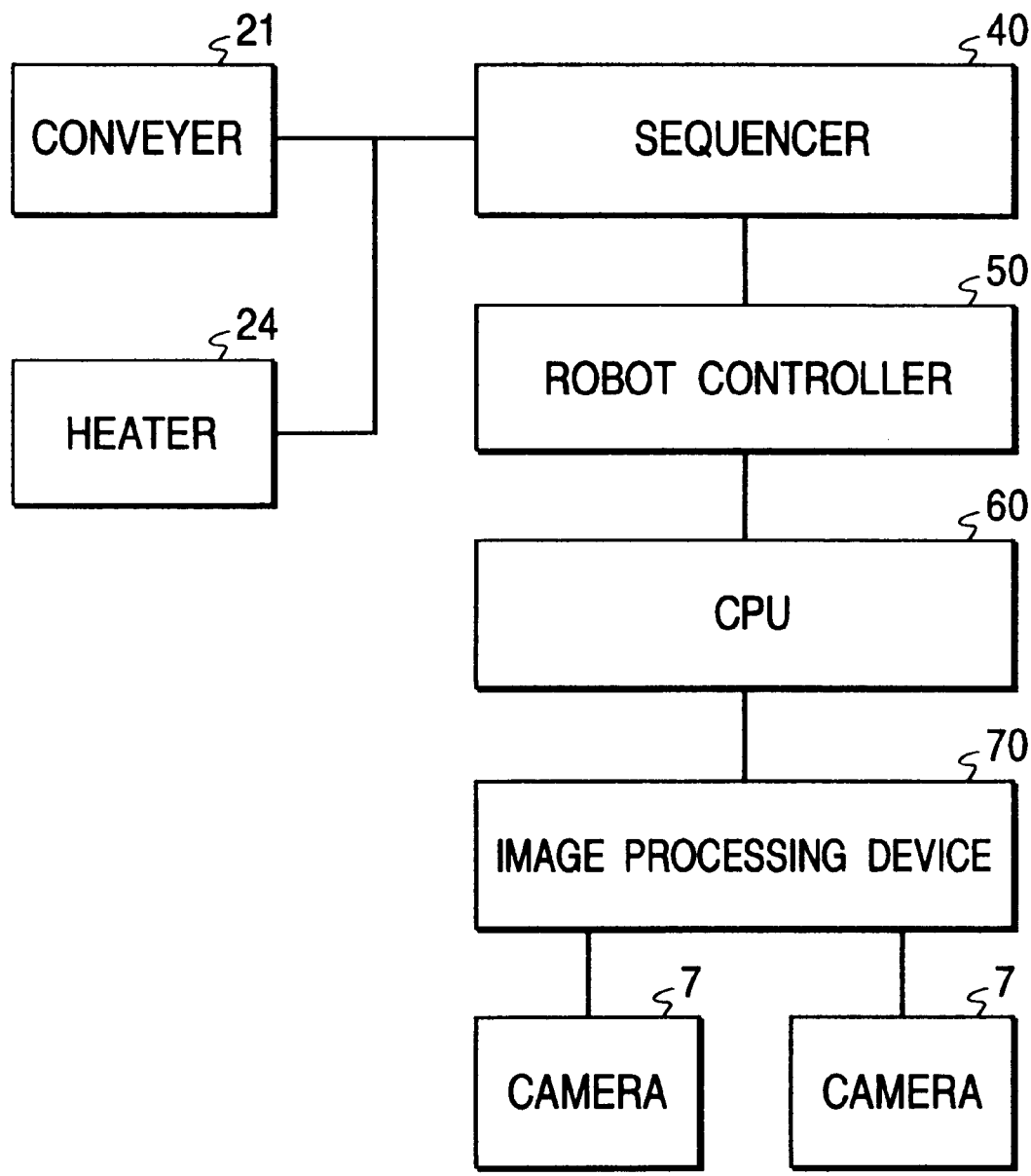
FIG. 7 is a block diagram of an operation control unit.

FIG. 7 shows the configuration for controlling the operation. The conveyer 21, the heater 24, and a robot controller 50 which controls the operations of the component mounting head 8 and the heater head 24 are connected to a sequencer 40 which controls the operations of the whole system. An image processing device 70 is connected to a robot controller 50 via a CPU 60. The two cameras 7 are connected to the image processing device.

In the embodiment, since the component mounting head 8 and the heater head 24 are separately disposed, the heat of the heater head 24 will not propagate to the component mounting head 8. Accordingly, the mounting of the TCP 3 by the component mounting head 8 can be performed with high accuracy and without being affected by heat. In addition, since the component mounting head 8 and the heater head 24 are separately disposed, for example, the operation of taking out the TCP 3 from the feeder 2 by the component mounting head 8 can be performed simultaneously with the operation of applying an adhesive or the like by the heater head 24. Accordingly, the component mounting operation can be rapidly performed.

In the embodiment, the soldering is performed by blowing out hot air from the heater 26. As compared with the prior art in which a hot bar is used, the mounting onto the soldering portion can be performed with lower accuracy. Specifically, the hot air is blown out from the air supply opening in a slightly spreading manner, and hence a relatively large displacement of the heater 26 with respect to the TCP 3 can be allowed. In the case of a hot bar, only a small displacement from the TCP 3 can be allowed. Thus, it is unnecessary to set the moving accuracy of the heater head 24 so as to be very high. In the case of the hot bar, the operations of aligning a contact portion in parallel and cleaning the contact portion are required. By contrast, in the embodiment, such operations are not required. Accordingly, the production cost and the maintenance cost of the heater moving mechanism 25 and the heater head 24 can be lowered.

When the TCP 3 is to be mounted on the printed circuit board 4 by the component mounting apparatus 1, the printed circuit board 4 is transported to a predetermined position of the working table 11 by the conveyer 21. Then, the component mounting head 8 is moved over the printed circuit board 4 by the head moving mechanism 12, and the light 13 of the component mounting head 8 is lit. The cameras 7 take images of the target reference marks 6 at the corresponding positions, and the image processing device 70 detects the positions of the marks 6. The detected positions are stored in the CPU 60. The component mounting head 8 is further moved so as to be positioned over the TCP 3 supplied from the feeder 2. The suction nozzle 5 is advanced out by the reciprocation motor 10, and the suction nozzle 5 sucks and holds the TCP 3. Then, the suction nozzle 5 is retracted so as to lift the TCP 3. In a condition where the TCP 3 is held, the component mounting head 8 is moved onto the light stage 20.

The cameras 7 receives light rays from the light stage 20 so as to take an image of a part of the outline of the TCP 3, and the image processing device 70 detects the position of the TCP 3. The detected position is stored in the CPU 60. The TCP 3 is detected by means of transmission light, and hence the detection can be performed with high accuracy. The images taken by the two cameras 7 are sent to the image processing device 70 shown in FIG. 7, and positions of the corners or the outwardly projected terminals in the images are detected, thereby detecting the position of the TCP 3. In the case where the TCP 3 bears a mark useful in positioning, the mark may be detected. Alternatively, a characteristic shape of the component may be detected. During this detection, the suction nozzle 5 is rotated in a step of 45° by the rotation motor 9. As a result, the outline of the terminals of the TCP 3 and that of the TCP 3 itself can be obtained, and hence a possible defect of the TCP 3, and the number and possible bending of the terminals of the TCP 3 can be detected. Accordingly, it is possible to judge nondefective/defective TCPs. In the case where the two cameras 7 are used, it is sufficient for the suction nozzle 5 to be rotated only by 180°, but the positional relationships between the two cameras 7 must be corrected. In the case where one of the two cameras 7 is used, the detection can be preformed only by rotating the nozzle by 360°.

The CPU 60 calculates the positions of component reference marks 33 corresponding to the TCP 3, from the detected position of the TCP 3. The component reference marks 33 are calculated marks and formed at positions which, when the TCP 3 is mounted to the target position, are coincident with the target reference marks 6.

Since the target reference marks 6 on the printed circuit board 4 are already detected and stored, a holding angle error produced between the angle at which the TCP 3 is to be mounted and the angle at which the TCP 3 is actually held can be calculated by comparing the positions of the target reference marks 6 with those of the component reference marks 33. The suction nozzle 5 is rotated on the basis of the holding angle error, so that the holding angle of the TCP 3 is made coincident with the angle at which the TCP 3 is to be mounted. Then, the component mounting head 8 is again moved over the printed circuit board 4.

On the other hand, in a period from the time when the component mounting head 8 which has not held the TCP 3 is retracted from the printed circuit board 4 to the time when the component mounting head 8 holding the TCP 3 is again positioned over the printed circuit board 4, the heater head 24 is moved onto the printed circuit board 4 by the heater moving mechanism 25 on the basis of the positions of the target reference marks 6 stored in the CPU 60. Flux and an adhesive are applied onto the printed circuit board 4 by the injectors 29 and 30. Thereafter, the heater head 24 is returned to the waiting position.

The component mounting head 8 holding the TCP 3 is again positioned over the printed circuit board 4, and the light 13 is lit. The cameras 7 again detect the target reference marks 6. As shown in FIG. 1, each of the fields of view F of the cameras 7 captures simultaneously the corresponding target reference mark 6 and a part of the outline of the TPC 3. The calculated position of the component reference marks 33 of the TCP 3 are compared with the positions of the target reference marks 6 which are actually detected, so as to calculate a positional error therebetween. The component mounting head 8 is moved by a feedback control so that the positional error becomes zero. When the positional error is zero and the TCP 3 reaches the position of the printed circuit board 4 to which the TCP is to be mounted, the suction nozzle 5 is advanced out. As a result, the TCP 3 is supplied onto the die attachment pad 210 of the printed circuit board 4 and adheres thereto.

Then, the heater head 24 is again positioned over the printed circuit board 4 by the heater moving mechanism 25. At this time, the heater 26 is positioned over the TCP 3 in a condition where the covers 27 are opened, and the covers 27 are then closed. Hot air is blown out from the heater 26, so that the terminals of the TCP 3 are soldered to the printed patterns 22. At the same time, vaporized flux is aspirated by the blower 28. Accordingly the flux vapor will not spread out.

The above-described embodiment is a preferred embodiment of the invention, but the invention is not limited to the embodiment. Various modifications may be performed without departing the scope of the invention. For example, the apparatus may be modified by omitting the light stage. When the component mounting head receives a component from the feeder, the head is moved as it is to the target position. At the target position, the position of the component is detected, and the angle adjustment and the positioning are performed. Thereafter, the component is supplied onto a circuit board. In the embodiment, the heater head 24 is disposed in the component mounting apparatus 1. Alternatively, the heater head 24 may be disposed as a separate apparatus. That is, the component mounting apparatus 1 may be configured as an apparatus only for causing the TCP 3 to adhere onto the printed circuit board 4.

As is apparent from the above description, according to the component mounting apparatus of the invention, a target reference mark and a component can be simultaneously detected by the same camera. Therefore, the mounting position of the component can be determined by a feedback control while the position of the target reference mark is compared with the component position. Consequently, the component can be mounted with high accuracy, and the highly accurate condition can be stably maintained without being affected by external environments such as a temperature and humidity. In addition, the positional accuracy of the component mounting head does not have a direct relationship with the mounting accuracy of the component, so that it is unnecessary to set the positional control of the component mounting head with especially high accuracy. Thus, it is possible to reduce the production cost and the maintenance cost of the head moving mechanism and the like.

Since a camera is disposed at two positions located on both sides of the suction nozzle, the target reference marks can be detected simultaneously. Accordingly, an error of the holding angle of the component can be calculated with higher accuracy, so that the component can be mounted with high accuracy. In addition, the holding unit includes the suction nozzle, and hence the holding of the component can be surely performed.

What is claimed is:

1. A component mounting apparatus comprising:
    a component mounting head having a holding unit for holding a supplied component and for mounting said component to a predetermined target position, and a camera for detecting a position of a target reference mark formed in the vicinity of said target position, and for detecting a holding position of said component with respect to said holding unit, and said camera simultaneously detecting said position of said target reference mark and said holding position;
    error calculating means for calculating an error of a holding angle of said component on the basis of said position of said target reference mark and said holding position;
    an angle adjusting mechanism for adjusting an angle of said holding unit on the basis of the holding angle error;
    a head moving mechanism for moving said component mounting head on the basis of said position of said target reference mark and said holding position of said component, thereby positioning said component to said target position; and
    a heater head independently disposed from said component mounting head, wherein each of said heads moves independently in X and Y directions, and
    wherein a guiding shaft for one of the X and Y directions is common to said component mounting head and said heater head.

2. A component mounting apparatus according to claim 1, wherein said camera judges a nondefective/defective state of said component while said angle adjusting mechanism rotates said component in a step of a predetermined angle.

3. A component mounting apparatus according to claim 1, wherein said camera comprises at least two cameras, said two cameras being placed at diagonal positions of said component which is held on said holding unit by a suction nozzle.

4. A component mounting apparatus according to claim 1, wherein a component reference mark position corresponding to said component is calculated from said holding position of said component, and the error is calculated by using said component reference mark position.

5. A component mounting apparatus according to claim 4, wherein a position to which said component is to be mounted is determined by aligning said component reference mark position with said target reference mark.

6. A component mounting apparatus comprising:
    a component mounting head having a holding unit for holding a supplied component and for mounting said component to a predetermined target position, and a camera for detecting a position of a target reference mark formed in the vicinity of said target position, and for detecting a holding position of said component with respect to said holding unit, and said camera simultaneously detecting said position of said target reference mark and said holding position;
    error calculating means for calculating an error of a holding angle of said component on the basis of said position of said target reference mark and said holding position;
    an angle adjusting mechanism for adjusting an angle of said holding unit on the basis of the holding angle error;
    a head moving mechanism for moving said component mounting head on the basis of said position of said target reference mark and said holding position of said component, thereby positioning said component to said target position; and
    a heater head independently disposed from said component mounting head, wherein each of said heads moves respectively along guiding shafts in X and Y directions, and
    wherein one of said guiding shafts for one of the X and Y directions is common to said component mounting head and said heater head.

7. A component mounting apparatus according to claim 6, wherein a component reference mark position corresponding to said component is calculated from said holding position of said component, and the error is calculated by using said component reference mark position.

8. A component mounting apparatus according to claim 7, wherein a position to which said component is to be mounted is determined by aligning said component reference mark position with said target reference mark.

9. A component mounting apparatus according to claim 6, wherein said camera judges a nondefective/defective state of said component while said angle adjusting mechanism rotates said component in a step of a predetermined angle.

10. A component mounting apparatus according to claim 6, wherein said camera comprises at least two cameras, said two cameras being placed at diagonal positions of said component which is held on said holding unit by a suction nozzle.

* * * * *